United States Patent [19]
Robillard

[11] Patent Number: 5,364,739
[45] Date of Patent: Nov. 15, 1994

[54] NONSILVER X-RAY RECORDING PROCESS

[75] Inventor: Jean J. Robillard, El Paso, Tex.

[73] Assignee: Board of Regents, The University of Texas System, Austin, Tex.

[21] Appl. No.: 835,747

[22] Filed: Feb. 13, 1992

[51] Int. Cl.[5] ............................................. G03C 5/16
[52] U.S. Cl. ..................................... 430/292; 430/300; 430/336; 430/338; 430/350; 430/351; 430/363; 430/964; 430/966; 430/967
[58] Field of Search ............... 430/292, 967, 966, 964, 430/351, 350, 336, 330, 363, 273, 338

[56] References Cited

U.S. PATENT DOCUMENTS

| | | | |
|---|---|---|---|
| 3,448,979 | 6/1969 | Farmer | 271/33 |
| 3,451,338 | 6/1969 | Baum . | |
| 3,954,468 | 5/1976 | Lewis et al. | 430/296 |
| 3,957,515 | 5/1976 | Robillard | 430/336 |
| 3,967,130 | 6/1976 | Decker | 250/468 |
| 4,394,439 | 7/1983 | Robillard | 430/336 |
| 4,699,872 | 10/1987 | Robillard | 430/336 |

FOREIGN PATENT DOCUMENTS

| | | | |
|---|---|---|---|
| 2204151 | 5/1974 | France . | |
| 2-191954 | 7/1990 | Japan | 430/967 |

OTHER PUBLICATIONS

Brown et al., "Radio Frequency Heating of Poor Electrical Conductors" *Theory and Application of Radio-Frequency Heating*, Chapter 17, pp. 206–209 (1974).

Tani et al. "Heat-Sensitive Recording Material", Official Gazette, No. 5,070,067, p. 376, Dec. 3, 1991.
Webster's Ninth New Collegiate Dictionary pp. 401 & 970 (1983).
PCT Search Report Mailed Apr. 1, 1993.

*Primary Examiner*—Janis Dote
*Attorney, Agent, or Firm*—Arnold, White & Durkee

[57] ABSTRACT

An X-Ray sensitive composition including one or several photopolymerizable monomer or photocrosslinkable polymer systems and thermochromic substances which can be used in a dry X-Ray reproduction process. The process is based on the different dielectric constants and dielectric losses exhibited by a monomer and the corresponding polymer or a polymer and the crosslinked polymer and the reaction of certain thermochromic substances which exhibits a specific threshold temperature above which these substances change from a colorless form to a color stable form. The X-Ray sensitive element is exposed according to a pattern of X-Ray with spatial modulation providing an X-Ray image to form a latent image of polymerized or crosslinked zones and unpolymerized or non crosslinked zones. Exposed elements are developed by passing through a high frequency electrical field which raises the temperature of the polymerized or crosslinked zones by dielectric heating to above the color threshold temperature of the thermochromic substance. An Apparatus for carrying out the process is also described.

8 Claims, 3 Drawing Sheets

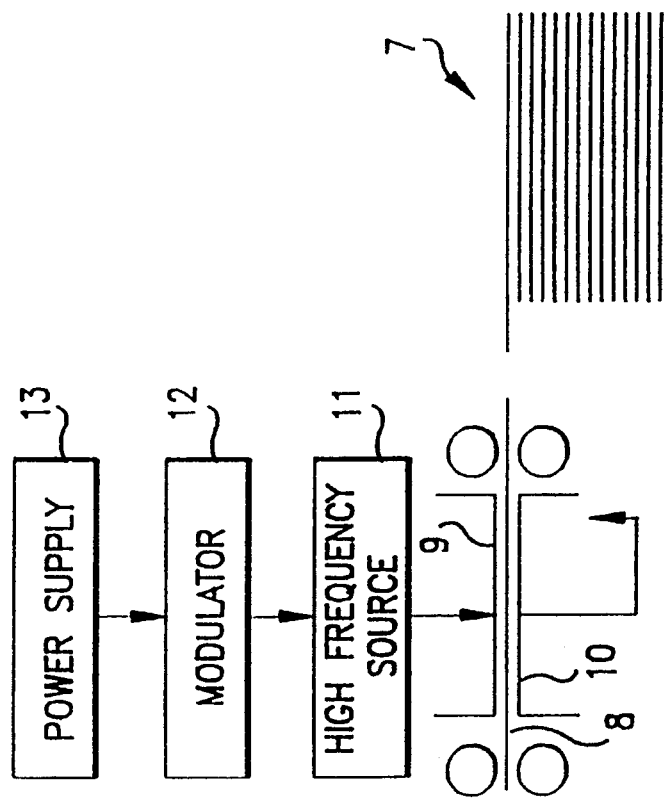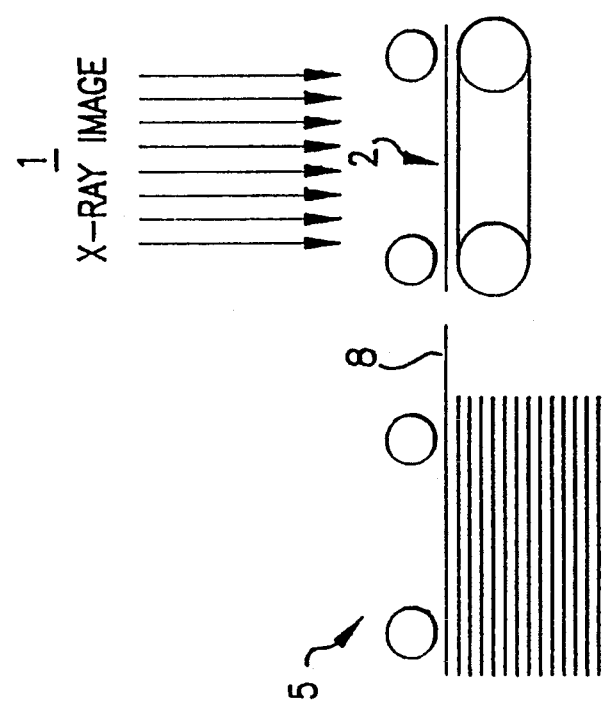
FIG.1

FIG.2

| TIME | AMPLIFICATION MECHANISM | | | |
|------|---------|-----------|-----------|---------|
| | ILLUMINATED AREA | DARK AREA | DENSITY | |
| $t_0$ (1) | $T_0$ $\varepsilon_0''$ $D_0$ | $T_0$ $\varepsilon_0''$ $D_0$ | DARK DARK ──────── $t_0 D_0$ | $\varepsilon_0'' = F(\phi, T)$ WITH APPLIED RF FIELD : $T = F(\varepsilon_0'', \phi, V, T)$ $D = F(T)$ $\varepsilon_0''$ : DIELECTRIC LOSS $\phi$ : LIGHT INTENSITY $T$ : TEMPERATURE $t$ : TIME $V$ : RF VOLTAGE $D$ : IMAGE DENSITY |
| $t_1$ (2) | $T_1$ $\varepsilon_0'' + \Delta\varepsilon_0''$ $D_1$ | $T_1'$ $\varepsilon_0'' + \delta\varepsilon_0''$ $D_0$ | LIGHT DARK ──┐___ $t_1 D_1$ | |
| $t_2$ (3) | $T_2$ $\varepsilon_0'' + \Delta(\varepsilon_0'' + \Delta\varepsilon_0'')$ $D_2$ | $T_2'$ $\varepsilon_0'' + \delta(\varepsilon_0'' + \delta\varepsilon_0'')$ $D_0$ | LIGHT DARK ──┐___ $t_2 D_2$ | |
| $t_3$ (4) | $T_3$ $\varepsilon_0'' + \Delta\{\varepsilon_0'' + \Delta(\varepsilon_0'' + \Delta\varepsilon_0'')\}$ $D_3$ | $\varepsilon_0'' + \delta\{\varepsilon_0'' + \delta(\varepsilon_0'' + \delta\varepsilon_0'')\}$ $D_0$ | LIGHT DARK ──┐___ $t_3 D_3$ | |

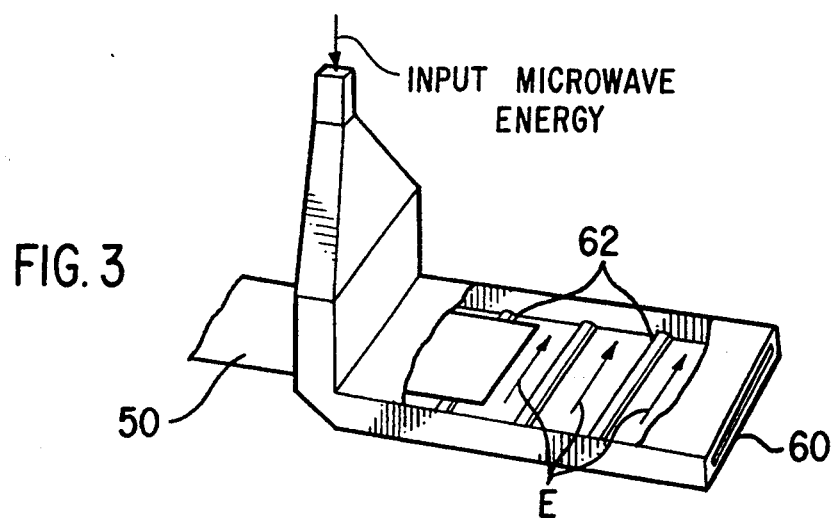
FIG. 3
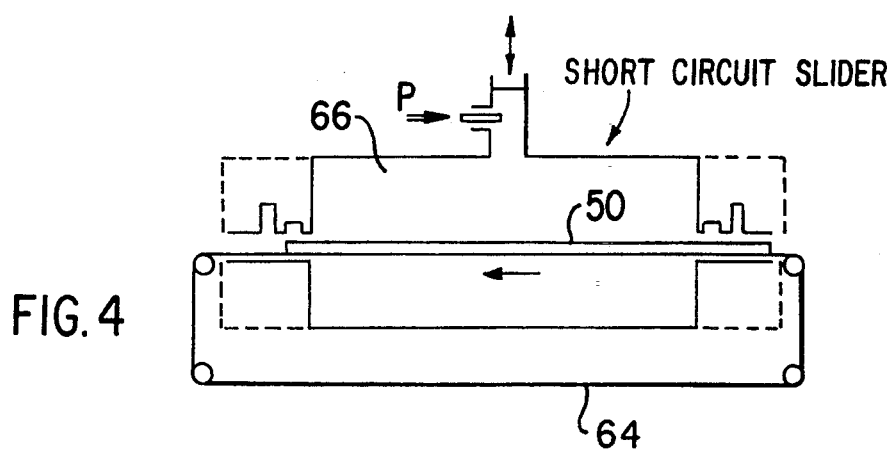
FIG. 4
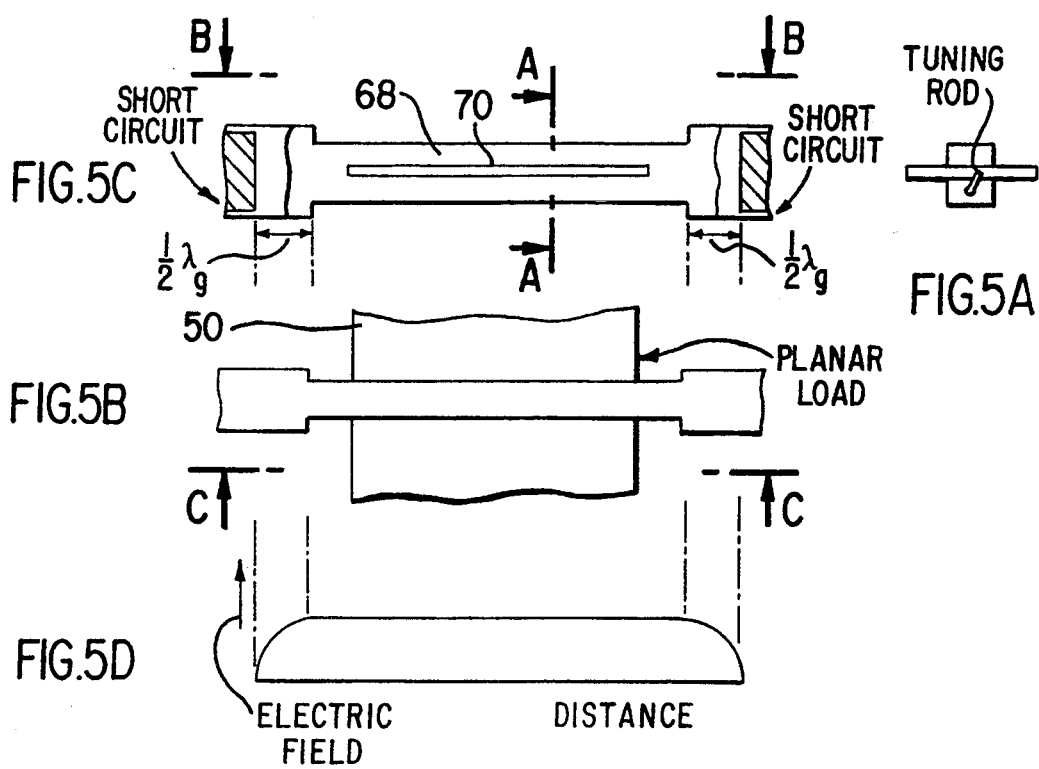
FIG. 5A
FIG. 5B
FIG. 5C
FIG. 5D

NONSILVER X-RAY RECORDING PROCESS

BACKGROUND OF THE INVENTION

1. Field of the Invention

The invention relates to an X-Ray composition and an X-Ray sensitive element useful in a novel X-Ray recording process. An apparatus particularly suited to practicing the X-Ray recording process is also disclosed.

2. Description of Related Art

Most X-Ray recording processes that allow production of a permanent recording are based on photochemical reactions and require use of liquid chemical agents to develop and fix the image. This is the case in conventional silver-based processes in which silver halide is used as the X-Ray sensitive compound. Storage, handling and disposal of the required solutions entail safety precautions because of possible toxicity to humans and to the environment.

Other disadvantages are associated with liquid developers and fixers. As with any liquid, attention must be paid to containers, the need to be renewed at regular time intervals and, above all, protection of the immediate environment from spills and subsequent exposure.

There are X-Ray recording processes that do not use silver, namely processes that are based on xerography. However, these processes are considerably less sensitive than silver halide. Bulky equipment is required for development and the toners used may contain selenium and are quite toxic.

A nonsilver X-Ray recording process is described in U.S. Pat. No. 4,394,439. The process is based on the generation of free radicals resulting from photodegradation of certain polymeric materials exposed to X-Rays and a dye forming reaction initiated by the free radicals. Disadvantages of this process are low sensitivity and the requirement for chemical fixing.

U.S. Pat. No 4,699,872 also relates to a nonsilver recording process. This process is based on the sensitivity of choline chloride to high energy radiations, including X-Rays. Products of the photodissociation of choline chloride generate a dye which is responsible for the image. An undesirable feature of this process is the unpleasant odor generated during heat development of the image. An even more serious disadvantage is the lack of emulsion stability.

It can be seen that most of the existing processes for the recording of X-Ray images suffer from some disadvantage. Some of these are overcome by using nonconventional processes that do not employ silver solutions; however many nonsilver processes have low sensitivity, instability or unacceptable odor.

SUMMARY OF THE INVENTION

The present invention addresses one or more of the foregoing problems or deficiencies of currently practiced X-Ray recording processes by providing a process that does not require the use of liquid developers or fixers while providing sensitivity comparable to that of silver halide. The disclosed process is insensitive to normal ambient visible light. Generally, the process of the present invention employs an X-Ray activated photopolymerization reaction which under a high frequency field will result in a thermal gradient able to build a visible image by the transformation of thermosensitive dyes.

The present invention provides a process for forming a negative recording of an X-Ray image. This process takes advantage of different dielectric constants and losses exhibited by photocrosslinked polymers and non crosslinked polymers. Selected thermochromic materials will exhibit a specific threshold temperature above which there is a change from a colorless form to a colored stable form.

According to the process of the present invention, an X-Ray sensitive element comprised of a polymerizable monomer or a photocrosslinkable polymer system and a thermochromic substance is distributed onto one or two layers carried on a suitable substrate. The element is exposed to an X-Ray image thereby forming a latent image of polymerized or crosslinked zones and unpolymerized or non crosslinked zones. The exposed X-Ray sensitive element is then developed by passing it through a high frequency electric field. The temperature of the polymerized or crosslinked zones is raised by dielectric heating to above the coloration threshold temperature of the thermochromic substances causing a change from a colorless or substantially colorless form to a stable, colored form.

Another aspect of the invention is an X-Ray sensitive composition which includes a polymerizable monomer system or a photocrosslinkable polymer system and a thermochromic substance. At a specific temperature (hereafter referred to as threshold temperature, $T_c$) the thermochromic substance undergoes a transformation from a colorless or only weakly colored, stable form.

There is also provided, according to the present invention, an X-Ray sensitive element which can be used in the recording process of the present invention. The element includes a coating of the herein described X-Ray sensitive composition on a suitable substrate. The X-Ray sensitive composition may be applied to the substrate as a single first layer of either polymerizable monomers or a photocrosslinkable polymer system and a second layer of thermochromic substance.

The present invention also provides a novel system for performing the foregoing X-Ray recording process. According to the present invention an apparatus is provided which includes an X-Ray exposure means for exposing the X-Ray sensitive element to an X-Ray source; and a means for applying a high frequency electric field to the exposed X-Ray sensitive element.

The X-Ray exposure means may be any conventional X-Ray device used for industrial, medical or dental purpose and would typically include an X-Ray source, a high voltage supply, a timer and several filters. Typical suitable models are Hewlett Packard Faxitron Model 43855A, Gendex GX770, or General Electric GE 1000 available respectively from, Hewlett Packard Co., 1501 Page Mill Rd., Palo Alto, Calif. 94304, Gendex Corporation, Box 21004, Milwaukee, Wis. 53221, and General Electric Co, P.O. Box 414, Milwaukee, Wis. 53201.

A high frequency electric field is applied across two electrodes, for example, silver coated brass electrodes, through which the exposed film containing the latent image of polymer and monomer of different dielectric constant passes for a time sufficient to heat only the polymerized or crosslinked zones to a temperature above the color threshold ($T_c$) of the thermochromic substance contained therein. The electrodes are connected to a suitable generator which generates the high frequency electric field of adjustable intensity. The generator is controlled by a regulator and power source, according to systems available and well known in the art.

For frequency in the gigahertz range ($10^9$ Hertz) the high frequency electric field may be guided through a waveguide structure and applied through special applicator structures shown in FIGS. 3, 4 and 5, 5A to 5D.

BRIEF DESCRIPTION OF THE DRAWINGS

FIG. 1 is a schematic diagram of the process and apparatus of the invention where 1 is the object to be X-Rayed, 2 is the X-Ray image, 5 is the unexposed recording element, 7 is the receiving tray for the exposed recording element; 9 and 10 are electrodes disposed opposite each other on either side of exposed element 8, 11 is a generator, 12 is a regulator and 13 a power source.

FIG. 2 illustrates the amplification mechanism operative in producing HF heating from increases in $\epsilon$ and $\tan\delta$.

FIG. 3 is a periodic structure applicator consisting of a parallel plate 60 loaded with inductive posts 62 and exposed, moving film 50.

FIG. 4 shows a microwave setup with a conveyor belt 64 and an X-Ray sensitive element 50 that moves inside a cavity 66.

FIG. 5A shows a tuning rod. FIG. 5B shows film 50. FIG. 5C shows an applicator 68 as part of a waveguide. Exposed X-ray sensitive film moves through slot 70 in the guide 68. FIG. 5D shows the relation of the high frequency electric field to the waveguide structure applied through the special applicator 68 of Figure C.

DETAILED DESCRIPTION OF PREFERRED EMBODIMENTS

The present invention will now be described in greater detail in connection with the assistance of accompanying FIG. 1 which is a schematic illustration of one embodiment of the X-Ray recording system used in carrying out the process of the present invention.

Dielectric heating is a term applied to the generation of heat in nonconducting materials subjected to an alternating electric field of high frequency. In practice the nonconducting load is placed between two electrodes across which the high frequency voltage is applied.

The amount of heat, Q, produced per second when a dielectric layer is subjected to high frequency electric field, because of dielectric losses, is given by the known formula:

$$Q = 5.91 \, Sf \frac{E^2}{4} \epsilon \tan\delta 10^{-12} \quad (1)$$

where:
S: Surface of the layer in $m^2$
f: Frequency of the electric field in cycle/sec
E: Voltage at the electrode terminals, in volts
$\epsilon$: Dielectric constant of the material of the layer
$\tan\delta$: Loss Angle (power factor)

This amount of heat Q results in an increase of temperature of the layer given by the formula (Brown, G. H., Hoyler, C. N. and Bierwirth, R. A. "Theory and Application of Radio Frequency Heating", D, Van Nostrand Co. Inc., New York, (1947); Cable, J. W. "Induction and Dielectric Heating", Reinhold, N.Y., (1947)).

$$T - T_o = \frac{Q}{mtc} \quad (2)$$

where:
T: temperature of the layer after heating, in °C.
$T_o$: ambient temperature in °C.
m: mass of material in the layer, in g
c: specific heat of the material in cal/g
t: time of exposure to the field in sec The present invention takes advantage of large differences in the dielectric constant and dielectric losses of a polymerizable monomer or a photocrosslinkable polymer and the corresponding polymer or crosslinked polymer in order to differentially heat a latent image containing polymer or crosslinked polymer in exposed regions and monomer or non crosslinked polymer in the unexposed regions. The polymer or crosslinked polymer is heated to a temperature above the color threshold temperature of a thermochromic substance present in the X-Ray sensitive element to thereby develop a latent image.

It can be seen from formula (1) and formula (2) that if the difference $\Delta\epsilon$ in the dielectric constant $\epsilon_1$ of the polymer or crosslinked polymer and the dielectric constant $\epsilon_2$ of the monomer or photocrosslinkable polymer where $\epsilon_2 - \epsilon_1$ is sufficiently great, it becomes possible to heat the exposed polymerized or crosslinked zones to a higher temperature than the unpolymerized or uncrosslinked, unexposed zones upon proper selection of parameters, e.g., frequency, time, X-Ray exposure, etc. Accordingly, a temperature gradient is readily created between the polymerized or crosslinked zones and the unpolymerized or non crosslinked zones such that coloration of the thermochromic substance will be produced in polymerized or crosslinked zones but not in unpolymerized or non crosslinked zones.

One important feature of the process is that the mechanism involved in the image formation provides physical amplification, shown schematically in FIG. 2, which can be explained as follows.

In each layer $\epsilon$ and $\tan\delta$ are also functions of the temperature. The HF heating resulting from variation of these parameters causes the same parameters to increase and thereby provide additional heating which in turn results in a new increase of $\epsilon$ and $\delta$, FIG. 2. This feedback mechanism is responsible for a multiplication process which globally results in amplification.

The amplification is dependent upon the dynamics of the system as a thermal equilibrium tends to establish over the heated portion of the substrate and the accumulation of incremental heat overcomes the heat lost by conduction. This behavior leads to an optimum speed, v, of development of the image which affects both the sensitivity of the process and the contrast of the image.

Within the scope of the invention any X-Ray sensitive polymerizable or photocrosslinkable system may be used, whether based on a process of homopolymerization, copolymerization or crosslinking, such that the difference $\Delta\epsilon$ between the dielectric constant $\epsilon_1$ of the polymerized or crosslinked zones and $\epsilon_2$ of the unpolymerized or non crosslinked zones, will be sufficient to allow heating of the polymerized or crosslinked zones which is substantially greater than that of the unpolymerized or non crosslinked zones when a high frequency electric field is applied to the X-Ray sensitive element, which has been previously exposed according to an X-Ray image. It is only necessary that the polymerized or crosslinked zones be brought by the dielectric heating to a temperature $T_1$ which is higher than the threshold temperature $T_c$ of the thermochromic substance in the X-Ray sensitive element, while the unpolymerized or non crosslinked zones remains at a temperature $T_2$ which is below the temperature $T_c$. Satisfactory results are obtained when $\Delta\epsilon > 0.2\epsilon$.

All known photopolymerizable or photocrosslinkable systems will provide a $\Delta\epsilon$ meeting the requirement for sufficient differential dielectric heating, i.e., $T_1 > T_c$ in exposed polymerized or crosslinked areas and $T_2 > T_c$ in unexposed unpolymerized or non crosslinked areas, if complete polymerization or crosslinking is obtained. Of course, for some polymerizable or crosslinkable systems and thermochromic substances, it may not be necessary to have complete polymerization or crosslinking in the exposed areas, but for best results the exposure conditions will be sufficient to provide substantially total or total polymerization or crosslinking of the exposed areas.

Some examples of the polymerizable systems which can be used in the present invention include the following well known polymerizable monomers: acrylic monomers, vinyl monomers, styrene resins, ethylene oxide, diacrylic monomer of polyethylene glycol, N-vinylcarbazole, methacrylamide, acrylate of barium sodium and lead, vinyl acetate, vinylsorbate, vinylacetal ester, cellulose acetate and cellulose hydrogen phthalate, cellulose alkyl ester, polyethane alkylene ether glycol, hexamethylene adipamide, β-diethyl aminoethylmethacrylate, chlorophene, and the like.

Typically, the polymerizable monomer system employs an ethylene type monomer and a photopolymerization initiator or catalyst, either singly or in combination with one or more similar monomers or initiators.

Preferred polymerizable monomers are often liquid at room temperature and may be dispersed in a suitable binder. Examples of suitable binders include both thermoplastic and thermosetting substances such as polyvinyl alcohol, hydroxyethylcellulose, styrene butadiene copolymer, gelatin, phenolic resins, melamine formaldehyde resins, casein, carboxymethylcellulose, and so forth.

Any of the well known photoinitiators or polymerization catalysts may be used in the X-Ray sensitive compositions of the present invention. Where high polymerization rates are not critical or where the reaction conditions and X-Ray sensitive compositions are such that high polymerization rates are obtained in the absence of a catalyst or photoinitiator, these components may be excluded from the compositions.

Examples of free radical generating addition polymerization initiators activated by X-Rays are found among certain organometallic compounds. The rate of generation of radicals depends upon absorption of X-Rays by the metal ions in the compounds and will therefore be optimum for heavy metal ions. Examples include: uranium acetate, hexaphenyldisilane, hexa (p-biphenyl) disilane, 1,2-diethyltetramethyldisilane, ethylpentamethyl disilane, bis(trimethylsilyl) mercury, thioxanthene-9-sulfoxide, 4,4,6-trimethyl-2-vinyl-1,3,2-dioxaborinane, trimethyltinchloride-N-tributylstannylsuccinimide and the like.

The amount of initiator and/or polymerization catalyst in the X-Ray sensitive composition will vary widely depending on the type of reactive monomer, reaction conditions, and so forth and are readily determined by a person skilled in the art. In general the initiator and/or catalyst preferably ranges from 0 to about 0.6% of the monomer.

Other additives conventionally used in photosensitive compositions may also be used in the composition of the present invention. Such additives typically include polymerization retarders or inhibitors, electron donors, surfactants, plasticizers and the like. A preferred example of a polymerization inhibitor is sodium p-nitrophenylacetate. These additives, when present in the X-Ray sensitive composition, are generally present in about the same amount as the polymerization catalyst.

Anionic, cationic, nonionic or amphoteric surfactants may be used in the present invention. Similarly, no particular restrictions are placed on the types of plasticizer or other additives such as humectant, filler pigments and so forth which may be incorporated into the compositions of the present invention.

Crosslinkable systems applicable to the present invention include well known X-Ray resists such as poly(allyl methacrylate-co-2 hydroxyethylmethacrylate), the poly(butene-1-sulfone), poly(2,3-dichloro-1-propylacrylate), poly(2-fluoroethyl methacrylate), poly(2,2,2 tri-fluoroethyl methacrylate), poly(hexafluorobutylmethacrylate), poly(chloromethylstyrene), poly(methylmethacrylate), polymethacrylonitrile, poly(vinyl-2-furylacrylate), poly(vinylcinnamilidene acetate), and the like.

Any thermochrome composition which has a distinct color threshold temperature may be used with preference in the present invention. As non limiting examples there may be mentioned mixtures of indolinic spiropyrans and phenols such as those described in U.S. Pat. No. 3,451,338; mixtures of indolinic spiropyrans and certain metallic salts of fatty acids such as those described in Swiss Patent 406,257; mixtures of phenols or metallic salts of fatty acids with benzothiazol spiropyran instead of indoline spiropyran, as described in French Patent 7,237,857; mixtures of carbazide and ferric salt, or urea and a lead salt, zinc thiocarbamate and a fatty acid salt, a metallic salt and hexamethylene tetramine, a thioamide derivative and a lead salt, thiosemicarbazide and a ferric salt, thiourea with a heavy metal salt, a hydrazide derivative and a ferric salt, and in numerous other examples (Day, J. H., Chem. Rev. 63, 65 (1963); Kosar, J. "Light Sensitive Systems", Wiley and Sons, New York, pp. 404–414 (1965)).

The X-Ray sensitive element will typically include a polymerizable or crosslinkable composition and a thermochromic substance in one or two layers supported on any suitable substrate which presents a flat surface that is sufficiently insulating. In this regard it will be readily understood that during the passage of the exposed X-Ray sensitive element through a high frequency electric field, the substrate will undergo uniform heating below the polymerized or crosslinked zones as well as below the unpolymerized or non crosslinked zones. The substrate therefore will contribute to the dielectric heating that produces the coloration of the thermochromic substance in the polymerized or crosslinked zones. Such contribution is advantageous in that the time required to reach the threshold temperature, $T_c$, will be correspondingly lowered. However, care must be taken to avoid having the heating from the substrate plus heating from the unpolymerized or non crosslinked zones of the exposed film being sufficient to raise the temperature of the unpolymerized or non crosslinked zones above $T_c$.

This is most easily accomplished by controlling the duration of heating, i.e., the duration of exposure of the exposed film to the high frequency electric field; for example, by carefully selecting the rate of passage of the exposed film between the electrodes that apply the high frequency electric field. Any conventionally used substrate for photographic composition may be used in the present invention, e.g., any natural or synthetic materials which can exist in film or sheet form. Suitable support materials for the substrate or base include, for example, paper (including opaque, transparent, waxed, and so forth), cellulosic esters, foil, plastics, and the like. The substrate should be flexible and preferably capable of being wound on a spool. The substrate can be transparent or non transparent. Plastic materials, particularly polyesters, are preferred substrate materials since their dielectric content does not vary as much as other materials as a function of take-up moisture.

The X-Ray sensitive composition of the polymerizable or crosslinkable composition and the thermochrome may be coated on the substrate in a single layer. Alternatively, two separate superposed layers may be used with the polymerizable or crosslinkable system in one and the thermochromic substance in the other. Any conventional coating means, such as a coating knife, a blade, Meyer bar, calenders and so forth may be employed.

When a single layer is employed the composition containing both the polymerizable monomer or crosslinkable polymer and thermochromic substances will preferably be applied to the substrate at a rate of about 2 g/m$^2$ to 20 g/m$^2$ to provide a dry coating containing about 60% of polymerizable monomer or crosslinkable polymer and 40% of thermochromic composition.

Where separate layers of polymerizable or crosslinkable composition and thermochromic composition are applied to the substrate, the former will preferably be applied first at a rate of about 1.2 g/m$^2$ to 18 g/m$^2$ and, after drying, the second layer containing the thermochromic substance will be applied at a rate of about 0.8 g/m$^2$ to about 10 g/m$^2$.

DETAILED DESCRIPTION OF PREFERRED EMBODIMENTS

The accompanying figures and diagrams illustrate the process and apparatus of the present invention. In FIG. 1, 1 represents the object to be X-Rayed, 2 is the X-Ray image, 5 is the unexposed recording element according to the invention and 7 is the receiving tray for the exposed recording element; 9 and 10 are electrodes disposed opposite each other on either side of exposed element 8, serving to apply thereto a high frequency electric field furnished by generator 11, controlled by regulator 12 and supplied by power source 13. The power supply remains on, but the high frequency is only connected during the development period.

FIGS. 3-5 show various alternatives of applicators for practicing the present invention with electric field in the gigahertz range. FIG. 3 illustrates a periodic structure applicator developed by Van Koughnett (J. Microwave Power 1975), consisting of a parallel plate 60 loaded with inductive posts 62 all along its length. Waves propagate in different directions within the posts 62, setting up a standing wave field which can be strongly coupled to the exposed, moving film (X-Ray sensitive element 50). The apparatus shown in FIG. 4 is very similar to domestic microwave ovens. A conveyor belt 64, containing the X-Ray sensitive element 50, moves inside a large cavity 66 in a standing wave field. FIGS. 5A to 5D show an applicator 68 as part of a wave guide. The exposed X-Ray sensitive film 50 moves through a slot 70 in the guide 68 which is operating near cutoff conditions (Curran, Symposium of Electrical Power and Chemical Engineering, 1966).

In accordance with process of the present invention, good quality images may be obtained using high frequency generators having an effective output power from 2 to 15 watts. The rate of passage of the exposed film between the electrodes should be on the order of about 10 to 1000 cm per second depending on the coloration threshold temperature, polymerizable system, and so forth. The preferred rate of passage is about 50 cm per second. Appropriate frequencies are generally from about 10 to 100 megacycles per second. Particularly good results are obtained with a frequency of about 60 megacycles and a rate of passage of about 50 cm per sec.

These values were used with the X-Ray sensitive elements described in the following examples to provide good contrast images with appropriate color. In these examples the order of magnitude of the parameters involved in formula (1) were as follows:

E = 10 KV;
$\epsilon$ = 2.5–5.5
$\delta$ = 0.03 (cos$\theta$)
d = 10 microns

Of course the values of these parameters are merely indicative and will vary considerably from one composition to another; appropriate selection of these parameters is readily obtained by simple experimentation.

The X-Ray source for the exposure of the photopolymerizable or photocrosslinkable system may be any suitable source of X-Rays including the sources commonly used for industrial, medical or dental application.

The X-Ray source will generally be from 25 cm to 1 meter from the X-Rays sensitive element and the exposure times will vary from 0.01 to 10 second, depending on the intensity of the X-Rays, the thickness of the object to be X-Rayed and the degree of polymerization or crosslinking required for optimum imaging.

It is further apparent that by careful regulation of the difference between the temperature of the polymerized or crosslinked zones and threshold temperature $T_c$, it is possible to control contrast and density of the images.

The following examples are intended to illustrate the practice of the present invention and are not intended to be limiting. Although the invention is demonstrated with an X-Ray imaging method, similar principles would apply to imaging methods with other radiation. One need only determine that for any polymerizable material selected, polymerization would be sensitive to the wavelength employed to obtain the base image. Likewise, numerous heat sensitive chromophoric materials could be selected based on the color of background desired or on relative heat sensitivity to color formation. Examples 1-6 illustrate various preparations of photopolymerizable X-Ray sensitive emulsions. Example 7 illustrates a process for producing negative X-Ray images.

EXAMPLE 1

This example illustrates the preparation of Photopolymerizable X-Ray sensitive emulsion in two layers providing a dark blue image and having a threshold temperature $T_c$ = 120° C.

A polyester sheet (40 g/m$^2$) was first coated with a 12 g/m$^2$ emulsion of the following composition, at pH = 6.7:

| Acrylamide | 4.8 mole |
|---|---|
| N,N-methylene bisacrylamide | 0.35 mole |
| Lead diacrylate | 0.46 mole |
| Uranyl nitrate | 0.03 mole |
| Water | 100 g |

The polyester was allowed to dry and coated with a second layer (4.5 g/m²) of the following composition:

| 6'chloro 8'methoxybenzoindolino spiropyran | 15 g |
|---|---|
| 4,4'-isopropylidene diphenol | 65 g |
| Calcium stearate | 5 g |
| Polyvinyl alcohol | 15 g |
| Water | 100 g |

EXAMPLE 2

This example illustrates preparation of a photopolymerizable X-Ray sensitive emulsion providing a brown image with $T_c \sim 110°$ C. A polyester sheet (40 g/m²) was first coated with a 12 g/m² emulsion of the following composition:

| Barium lead acrylate (3:1) | 2.1 mole |
|---|---|
| Acrylamide | 2.6 mole |
| Hexaphenyldisilane | 0.03 mole |
| Sodium paranitrophenyl acetate | 0.017 mole |
| Maprenal (benzoguanamine-formaldehyde copolymer) (Hoegst) | 30 g |
| Water | 10 cc |

This layer was first dried and then coated with a second 4.5 g/m² layer of the following composition:

| Silver behenate | 350 mg |
|---|---|
| Calcium stearate | 300 mg |
| Spiro[methyl-2-naphtho-3H-(2,1b)-pyran-3,2'-methyl-3'-benzothiazoline] | 200 mg |
| Polyvinylpyrrolidone (10% sol) | 2.3 g |
| Surfactant (Armac) | 3.5 mg |
| Alcohol | 2.25 g |

EXAMPLE 3

This example illustrates the preparation of a photopolymerizable X-Ray sensitive emulsion with two layers, leading a dark-blue image with a $t_c = 120°C$.

A polyester sheet (40 g/m²) was first coated with a 12 g/m² layer of:

| Barium acrylate | 1.6 mole |
|---|---|
| Acrylamide | 1.6 mole |
| Bis (trimethylsilyl) mercury | 0.01 mole |
| Water | 100 g |
| Gelatin (2.6% by weight of the binder) | |

This layer was dried and coated with a second (4.5 g/m²) layer having the following composition:

| Calcium resinate | 550 g |
|---|---|
| Cobalt naphthenate | 100 g |
| Spiro[methyl-3-naphtho-3H-(2,1b)-pyran-3,2' methoxy-6'-methyl-3'-benzothiazoline | 330 g |
| Polyvinyl alcohol | 2215 g |
| Surfactant (Armac 18D, octadecanamine acetate used as a surfactant) | 8.5 g |

| Water | 2250 g |
|---|---|

EXAMPLE 4

This example illustrates the preparation of a photocrosslinkable X-Ray sensitive emulsion in two layers, providing a black image with a $T_c$ of 180° C.

A polyester sheet (40 g/m²) was coated with a 0.5 microns thick layer of poly (fluoromethacrylate). After drying, a second coating was made with the following composition (4.5 g/m²):

| Bismuth oxychloride | 26.1 g |
|---|---|
| Tin tartrate | 13.0 g |
| Semicarbazide | 20 g |
| Diphenylamine | 20 g |
| Di-isopropylamine | 10 g |
| Pliolite (styrene butadiene copolymer used as a binder) (Goodyear) | 2 g |
| Toluene | 20 g |

EXAMPLE 5

This example illustrates the preparation of a photocrosslinkable X-Ray sensitive emulsion in two layers, providing a black-blue image with a $T_c$ of 120° C.

A polyester sheet (40 g/m² was coated with a 2 micron thick layer of poly (vinyl-2-furylacrylate). After drying, a second coating was made with the following composition (4.5 g/m²):

| Calcium Resinate | 55 g |
|---|---|
| Cobalt Naphthenate | 10 g |
| Spiro[methyl-3-naphtho-3H-(2,1-b)-pyran-3,2'-methyl-3'-benzothiazoline] | 33 g |
| Polyvinyl alcohol (hydrolyzed 88%) | 221 g |
| Water | 225 g |
| Armac (18D), octadecanamine acetate used as a surfactant | 8.5 g |

EXAMPLE 6

This example illustrates the preparation of a photocrosslinkable X-Ray sensitive emulsion in two layers, providing a dark blue image with a $T_c$ of 120° C.

A polyester sheet (40 g/m²) is coated with a 10 microns thick layer of poly (vinylcinnamilidene acetate). After drying, a second coating was made with the following composition:

| 6'-chloro-8'-methoxybenzoindolino spiropyran | 15 g |
|---|---|
| 4,4'-ispropylidene diphenol | 65 g |
| calcium stearate | 5 g |
| Hydrolyzed Polyvinyl alcohol (98%) | 15 g |
| Water | 100 g |

EXAMPLE 7

Process for Negative Recording of an X-Ray Image

This example illustrates a process for forming a negative recording of an X-Ray image. Different dielectric constants and heat losses exhibited by a monomer and its corresponding polymer result in selective reaction of an overlying layer of thermochromic material on a substrate. X-Ray sensitive film is prepared then exposed under the conditions described.

Preparation of X-Ray Sensitive Film

A polyester sheet (40 g/m$^2$) was first coated with a 12 g/m$^2$ emulsion of the following composition at pH 6.3.

| | |
|---|---|
| Barium lead acrylate (3:1) | 2.1 mole |
| Acrylamide | 2.6 mole |
| Uranium Acetate | 0.03 mole |
| Sodium paranitrophenyl acetate | 0.017 mole |
| Maprenal (benzoguanamine-formaldehyde copolymer) (Hoegst) | 30 g |
| Water | 10 cc |

This layer was dried and then coated with a second 4.5 g/m$_2$ layer of the following composition:

| | |
|---|---|
| Calcium resinate | 55 g |
| Cobalt naphthenate | 10 g |
| Spiro[methyl-3-naphtho-3H-(2,1b)-pyran-3,2-methoxy-6'-methyl-3-benzothiazoline | 33 g |
| Polyvinylalcohol | 221.5 g |
| Surfactant (Armac 18D, octadecanamine acetate used as a surfactant) | 0.85 g |

Exposure of the X-Ray Sensitive Film

The X-Ray sensitive film was exposed to an X-Ray image under the following conditions:

| | |
|---|---|
| X-Ray Tube: Beryllium Window | 25 mil |
| Voltage | 100 Kv |
| Current | 6 mA |
| Exposure Time | 0.5 sec |
| Development Power | 18 watts |
| Development Speed | 6 cm/sec |
| Microwave frequency | 2.450 MHz |

Immediately after exposure and development a dark blue image with optical density 2.1 was permanently recorded on the film.

What is claimed is:

1. A process for recording a negative X-ray image, comprising:
    providing a substrate having an X-ray sensitive composition distributed thereon, said composition comprising a photocrosslinkable substance, an X-ray activated initiator and a thermochromic substance having a threshold temperature above which a color change is detectable;
    exposing said X-ray sensitive composition to X-radiation wherein an object having X-ray transparent areas and non transparent areas is positioned between an X-ray source and said composition thereby causing crosslinking of the photocrosslinkable substance only in those areas corresponding to the transparent areas of said object; and
    passing said exposed X-ray sensitive composition through a high frequency electric field to selectively heat crosslinked areas to a temperature above the threshold temperature of the thermochromic substance wherein said thermochromic substance changes from a colorless or weakly colored form to a color stable form.

2. The X-ray recording process according to claim 1 wherein selective heat generation produced by absorption of a high frequency electric field by the exposed X-ray sensitive composition involves an amplification of the heating due to variation of a dielectric loss factor in the exposed X-ray sensitive composition with the temperature.

3. The X-Ray recording process according to claim 2 wherein the high frequency electric field has a frequency between about 10 and about 100 Megahertz.

4. The X-ray recording process according to claim 1 wherein the photocrosslinkable substance is poly(vinyl-2-furylacrylate).

5. The X-ray recording process according to claim 1 wherein the photocrosslinkable substance is poly(vinylcinnamylidene acetate).

6. The X-ray recording process according to claim 1 wherein the photocrosslinkable substance is poly(choloromethylstyrene).

7. The X-ray recording process according to claim 1 wherein the thermochromic substance comprises 6'-chloro-8'-methoxybenzoindoline spiropryan and 4,4'isopropylidene diphenol.

8. The x-ray recording process according to claim 1 wherein the thermochromic substance comprises spiro [methyl-3-naphtho-3H-(2,1b)-pyran-3-2'-methyl-3'-benzothiazoline] and cobalt naphthenate.

* * * * *

UNITED STATES PATENT AND TRADEMARK OFFICE
CERTIFICATE OF CORRECTION

PATENT NO.  :   5,364,739

DATED       :   November 15, 1994

INVENTOR(S) :   Jean J. Robillard

It is certified that error appears in the above-identified patent and that said Letters Patent is hereby corrected as shown below:

```
In claim 3, column 12, line 25, delete "X-Ray" and insert --X-
ray-- therefor.
```

Signed and Sealed this

Fourth Day of April, 1995

Attest:

BRUCE LEHMAN

*Attesting Officer*         *Commissioner of Patents and Trademarks*